(12) United States Patent
Katada et al.

(10) Patent No.: US 12,457,724 B2
(45) Date of Patent: Oct. 28, 2025

(54) ELECTROMAGNETIC WAVE ABSORBING SHEET

(71) Applicant: ZEON CORPORATION, Tokyo (JP)

(72) Inventors: Arinobu Katada, Tokyo (JP); Tomoko Yamagishi, Tokyo (JP); Mitsugu Uejima, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 452 days.

(21) Appl. No.: 17/420,719

(22) PCT Filed: Jan. 28, 2020

(86) PCT No.: PCT/JP2020/002871
§ 371 (c)(1),
(2) Date: Jul. 6, 2021

(87) PCT Pub. No.: WO2020/158692
PCT Pub. Date: Aug. 6, 2020

(65) Prior Publication Data
US 2022/0071068 A1     Mar. 3, 2022

(30) Foreign Application Priority Data
Jan. 28, 2019   (JP) .............................. 2019-012300

(51) Int. Cl.
*H05K 9/00*   (2006.01)
*C01B 32/159*   (2017.01)
*C01B 32/174*   (2017.01)

(52) U.S. Cl.
CPC ......... *H05K 9/0071* (2013.01); *C01B 32/159* (2017.08); *C01B 32/174* (2017.08)

(58) Field of Classification Search
CPC ...................................................... B82Y 30/00
See application file for complete search history.

(56) References Cited

U.S. PATENT DOCUMENTS

| | | |
|---|---|---|
| 2008/0318049 A1 | 12/2008 | Hata et al. |
| 2015/0368108 A1 | 12/2015 | Sone |
| 2018/0352660 A1* | 12/2018 | Hayashi ..................... C09J 7/21 |
| 2018/0370197 A1* | 12/2018 | Nagamune ............... C09D 7/61 |

FOREIGN PATENT DOCUMENTS

| | | | | |
|---|---|---|---|---|
| CN | 101163390 A | * | 4/2008 | ............... D06N 3/00 |
| JP | 2010261108 A | | 11/2010 | |
| JP | 2013082610 A | | 5/2013 | |

(Continued)

OTHER PUBLICATIONS

Jul. 27, 2021, International Preliminary Report on Patentability issued in the International Patent Application No. PCT/JP2020/002871.

(Continued)

*Primary Examiner* — Khanh T Nguyen
(74) *Attorney, Agent, or Firm* — KENJA IP LAW PC

(57) ABSTRACT

An electromagnetic wave absorbing sheet includes a sheet-shaped fibrous substrate and a plurality of carbon nanotubes attached to the sheet-shaped fibrous substrate. The attached amount of the carbon nanotubes in the electromagnetic wave absorbing sheet is 5 mass % or more. The electromagnetic wave absorbing sheet has a surface resistance of 20 Ω/sq. or more.

5 Claims, 1 Drawing Sheet

(56) References Cited

FOREIGN PATENT DOCUMENTS

| JP | 2018203969 A | 12/2018 | | |
|---|---|---|---|---|
| WO | WO 9405142 A1 | * | 3/1994 | ............... H05K 9/00 |
| WO | 2006011655 A1 | | 2/2006 | |
| WO | WO 2010113303 A1 | * | 10/2010 | ............. C01B 31/02 |
| WO | 2014115560 A1 | | 7/2014 | |
| WO | 2015093600 A1 | | 6/2015 | |
| WO | WO 2017110096 A1 | * | 6/2017 | ............. B32B 25/02 |

OTHER PUBLICATIONS

Apr. 14, 2020, International Search Report issued in the International Patent Application No. PCT/JP2020/002871.

\* cited by examiner

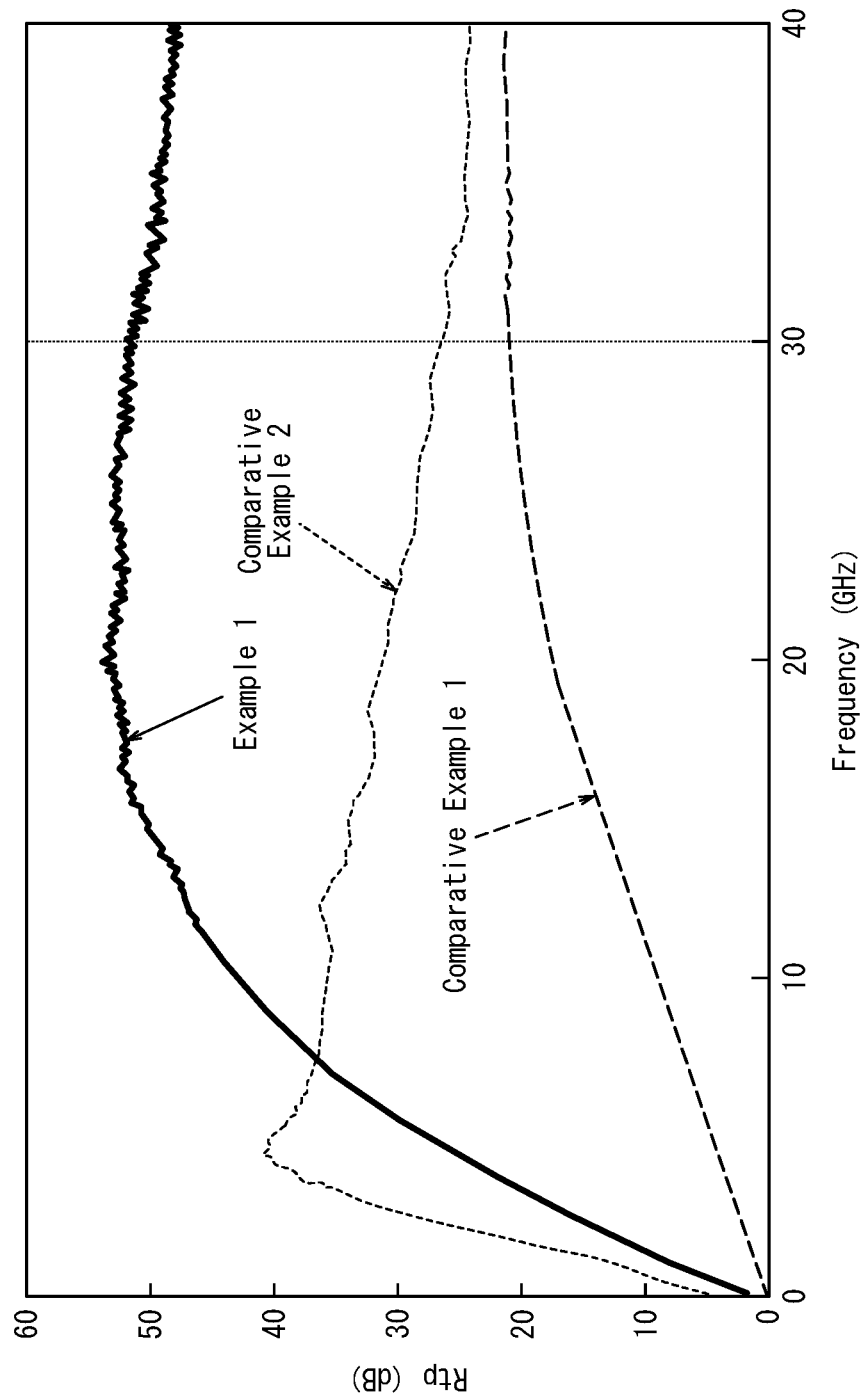

ELECTROMAGNETIC WAVE ABSORBING SHEET

TECHNICAL FIELD

The present disclosure relates to an electromagnetic wave absorbing sheet. In particular, the present disclosure relates to an electromagnetic wave absorbing sheet that contains carbon nanotubes.

BACKGROUND

Electromagnetic waves are used in communication devices and also in a wide range of other fields. In these fields, the used frequency differs depending on the application. However, in actual use environments, electromagnetic waves of frequency regions other than the required frequency region often occur as noise. For this reason, electromagnetic wave absorbing sheets have been used with the aim of blocking electromagnetic waves of unnecessary frequency regions that can act as noise.

In recent years, many studies have been conducted in relation to the use of electromagnetic waves of higher frequency regions. Electromagnetic wave absorbers having high absorption performance with respect to electromagnetic waves of high frequency regions have been proposed (for example, refer to Patent Literature (PTL) 1). PTL 1 proposes an electromagnetic wave absorber that includes a fibrous substrate and carbon nanotubes provided to the substrate and that satisfies a specific basis weight, porosity, conductivity, relative permittivity, and so forth.

CITATION LIST

Patent Literature

PTL 1: WO2015/093600A1

SUMMARY

Technical Problem

However, there is room for improvement of conventionally proposed electromagnetic wave absorbers such as that described above in terms of electromagnetic wave absorption performance in a high frequency region.

Accordingly, an object of the present disclosure is to provide an electromagnetic wave absorbing sheet having excellent electromagnetic wave absorption performance in a high frequency region.

Solution to Problem

The inventors conducted diligent studies with the aim of solving the problem set forth above. The inventors found that by setting the attached amount of carbon nanotubes in an electromagnetic wave absorbing sheet as not less than a specific value and by setting the surface resistance of the sheet as not less than a specific value, the electromagnetic wave absorbing sheet can be provided with excellent electromagnetic wave absorption performance in a high frequency region. In this manner, the inventors completed the present disclosure.

Specifically, the present disclosure aims to advantageously solve the problem set forth above, and a presently disclosed electromagnetic wave absorbing sheet comprises: a sheet-shaped fibrous substrate; and a plurality of carbon nanotubes attached to the sheet-shaped fibrous substrate, wherein an attached amount of the carbon nanotubes is 5 mass % or more, and the electromagnetic wave absorbing sheet has a surface resistance of 20 Ω/sq. or more. An electromagnetic wave absorbing sheet in which carbon nanotubes are attached to a sheet-shaped fibrous substrate has excellent electromagnetic wave absorption performance in a high frequency region when the attached amount of the carbon nanotubes is 5 mass % or more and the surface resistance of the electromagnetic wave absorbing sheet is 20 Ω/sq. or more as set forth above. Note that the attached amount of the carbon nanotubes in the electromagnetic wave absorbing sheet is a value that indicates the proportion (mass %) constituted by the carbon nanotubes contained in the electromagnetic wave absorbing sheet when the total mass of the electromagnetic wave absorbing sheet is taken to be 100 mass %, and can be measured by a method described in the EXAMPLES section. Moreover, the surface resistance of the electromagnetic wave absorbing sheet can be measured by implementing, in accordance with JIS K 7194, a four-point probe method in which a probe is positioned on one side of the electromagnetic wave absorbing sheet.

The presently disclosed electromagnetic wave absorbing sheet preferably has a thickness of 100 μm or less. When the electromagnetic wave absorbing sheet has a thickness of 100 μm or less, the electromagnetic wave absorbing sheet can suitably be used in mobile terminals such as smartphones and tablets, and also in various applications for which space-saving is a requirement. Note that the thickness of the electromagnetic wave absorbing sheet can be measured by a method described in the EXAMPLES section.

In the presently disclosed electromagnetic wave absorbing sheet, the carbon nanotubes preferably have a BET specific surface area of 600 m$^2$/g or more. When the BET specific surface area of the electromagnetic wave absorbing sheet is 600 m$^2$/g or more, the electromagnetic wave absorbing sheet has even better electromagnetic wave absorption performance in a high frequency region. Note that the term "BET specific surface area" as used in the present specification refers to nitrogen adsorption specific surface area measured by the BET (Brunauer-Emmett-Teller) method.

In the presently disclosed electromagnetic wave absorbing sheet, the sheet-shaped fibrous substrate is preferably non-woven fabric having a basis weight of 80 g/m$^2$ or less. When the sheet-shaped fibrous substrate is non-woven fabric having a basis weight of 80 g/m$^2$ or less, the electromagnetic wave absorbing sheet has even better electromagnetic wave absorption performance in a high frequency region. Note that the term "basis weight" refers to the mass of the non-woven fabric per unit area.

Another example of a presently disclosed electromagnetic wave absorbing sheet has a transmission attenuation power ratio value of 40 dB or more within a range of not less than 10 GHz and not more than 40 GHz. An electromagnetic wave absorbing sheet that satisfies the attribute set forth above has excellent electromagnetic wave absorption performance in a high frequency region. Note that the value of the "transmission attenuation power ratio" within a range of not less than 10 GHz and not more than 40 GHz can be measured by a method described in the EXAMPLES section.

Advantageous Effect

According to the present disclosure, it is possible to provide an electromagnetic wave absorbing sheet having excellent electromagnetic wave absorption performance in a high frequency region.

BRIEF DESCRIPTION OF THE DRAWING

In the accompanying drawing,

FIG. 1 is a graph illustrating results of evaluation of electromagnetic wave absorption performance for electromagnetic wave absorbing sheets obtained in Example 1 and Comparative Examples 1 and 2.

DETAILED DESCRIPTION

The following provides a detailed description of embodiments of the present disclosure. A presently disclosed electromagnetic wave absorbing sheet can suitably be used as what is referred to as a noise suppression sheet that is used to suppress high frequency noise and that can be mounted in a mobile terminal or other electronic device.

(Electromagnetic Wave Absorbing Sheet)

A presently disclosed electromagnetic wave absorbing sheet according to one example (hereinafter, also referred to simply as "the presently disclosed electromagnetic wave absorbing sheet") includes a sheet-shaped fibrous substrate and a plurality of carbon nanotubes attached to the sheet-shaped fibrous substrate. Features of the presently disclosed electromagnetic wave absorbing sheet are that the attached amount of the carbon nanotubes is 5 mass % or more and the surface resistance of the electromagnetic wave absorbing sheet is 20 Ω/sq. or more. The presently disclosed electromagnetic wave absorbing sheet may optionally contain other components such as additives used in production of the electromagnetic wave absorbing sheet. The presently disclosed electromagnetic wave absorbing sheet can display excellent electromagnetic wave absorption performance in a high frequency region.

Note that the carbon nanotubes are normally attached to the constituent fibers of the sheet-shaped fibrous substrate. When the carbon nanotubes are said to be "attached" to the constituent fibers of the sheet-shaped fibrous substrate, this means that the carbon nanotubes are present in a state in which they are attached or entangled on fibers that are constitutional units of the sheet-shaped fibrous substrate. In the presently disclosed electromagnetic wave absorbing sheet, it is normally preferable that the carbon nanotubes are in an attached state not only to fibers located at the surface of the sheet-shaped fibrous substrate, but also fibers located inward in a thickness direction of the sheet-shaped fibrous substrate. Particularly carbon nanotubes that are attached to fibers located inward in the thickness direction of the sheet-shaped fibrous substrate in the presently disclosed electromagnetic wave absorbing sheet are thought to cause attenuation through diffuse reflection of incident electromagnetic waves inside of the sheet, thereby causing absorption of electromagnetic waves.

<Sheet-Shaped Fibrous Substrate>

Sheet-shaped fibrous substrates formed of fibers, and particularly those formed of organic fibers, can suitably be used as the sheet-shaped fibrous substrate used in the electromagnetic wave absorbing sheet. Note that the organic fibers mentioned above are not considered to be inclusive of carbon nanotubes.

Examples of organic fibers that can form the sheet-shaped fibrous substrate include, but are not specifically limited to, synthetic fibers formed of polymers such as polyvinyl alcohol, Vinylon, polyethylene vinyl alcohol, polyethylene glycol, polyvinyl pyrrolidone, poly-ε-caprolactone, polyacrylonitrile, polylactic acid, polycarbonate, polyamide, polyimide, polyethylene, polypropylene, polyethylene terephthalate, and modified products thereof; and natural fibers such as cotton, hemp, wool, and silk. A polymer forming synthetic fibers may be one polymer used individually or a plurality of polymers used as a mixture. In particular, synthetic fibers are preferable as organic fibers, with Vinylon, which is an acetalized product of polyvinyl alcohol, being more preferable. The sheet-shaped fibrous substrate can be woven fabric or non-woven fabric formed of these organic fibers. In particular, the sheet-shaped fibrous substrate is preferably non-woven fabric. Note that the term "non-woven fabric" as used in the present specification refers to a "product in which fibers oriented in one direction or randomly in a fiber sheet, web, or batt are bonded to one another through at least one of entanglement, fusing, and adhesion" (however, paper, woven products, knitted products, tuft, and fulled felt are excluded) as defined in JIS L 0222:2001.

The basis weight of the sheet-shaped fibrous substrate is preferably 80 g/m$^2$ or less, more preferably 50 g/m$^2$ or less, and even more preferably 30 g/m$^2$ or less. When the basis weight is not more than any of the upper limits set forth above, it is possible to obtain an electromagnetic wave absorbing sheet having carbon nanotubes well attached in the inside of the sheet. As a result, electromagnetic wave absorption performance of the electromagnetic wave absorbing sheet in a high frequency region can be further enhanced. It is also preferable that the basis weight is not more than any of the upper limits set forth above in view of recent demand for weight reduction of electromagnetic wave absorbing sheets.

Note that from a viewpoint of increasing mechanical strength of the electromagnetic wave absorbing sheet and also further enhancing electromagnetic wave absorption performance of the electromagnetic wave absorbing sheet in a high frequency region, the basis weight of non-woven fabric serving as the sheet-shaped fibrous substrate is preferably 2 g/m$^2$ or more, and more preferably 6 g/m$^2$ or more.

Also note that in a case in which non-woven fabric is used as the sheet-shaped fibrous substrate, it is particularly preferable that the basis weight of the non-woven fabric satisfies any of the preferred ranges set forth above from a viewpoint of further enhancing electromagnetic wave absorption performance of the electromagnetic wave absorbing sheet in a high frequency region.

<Carbon Nanotubes>

The carbon nanotubes (hereinafter, also referred to as CNTs) contained in the presently disclosed electromagnetic wave absorbing sheet preferably include single-walled carbon nanotubes (single-walled CNTs) as a main component. Examples of components other than single-walled CNTs that can be included in the CNTs include multi-walled carbon nanotubes (multi-walled CNTs). The proportion constituted by single-walled CNTs among the total mass of the CNTs is preferably more than 50 mass %, more preferably 90 mass % or more, even more preferably 95 mass % or more, and may be 100 mass %. Note that in a case in which the CNTs include multi-walled CNTs, the number of walls in the multi-walled CNTs is preferably 5 or fewer.

The following describes preferable attributes of the CNTs. It is preferable that these attributes are applicable to both CNTs that are used as a material in production of the presently disclosed electromagnetic wave absorbing sheet and CNTs that are contained in the presently disclosed electromagnetic wave absorbing sheet. More specifically, at least the BET specific surface area, average diameter, and the like do not, as a rule, fall below values displayed by CNTs that are used as a material even after various types of treatment included in the subsequently described production method of the electromagnetic wave absorbing sheet.

The CNTs can be produced by a known CNT synthesis method such as arc discharge, laser ablation, or chemical vapor deposition (CVD) without any specific limitations. Specifically, the CNTs can be efficiently produced, for example, in accordance with a method in which, during synthesis of CNTs through chemical vapor deposition (CVD) by supplying a feedstock compound and a carrier gas to a substrate having a catalyst layer for carbon nanotube production at the surface thereof, catalytic activity of the catalyst layer is dramatically improved through the presence of a trace amount of an oxidant (catalyst activating material) in the system (super growth method; refer to WO2006/011655A1). Hereinafter, carbon nanotubes that are obtained by the super growth method are also referred to as "SGCNTs".

A t-plot for the CNTs obtained from an adsorption isotherm preferably exhibits a convex upward shape. Such CNTs are more preferably CNTs that have not undergone opening formation treatment.

The growth of an adsorbed layer of nitrogen gas for a substance having pores at the surface is divided into the following processes (1) to (3). The gradient of the t-plot changes in accordance with processes (1) to (3).
(1) A process in which a single molecule adsorption layer of nitrogen molecules is formed over the entire surface
(2) A process in which a multi-molecule adsorption layer is formed and is accompanied by capillary condensation filling of pores
(3) A process in which a multi-molecule adsorption layer is formed at a surface that appears to be non-porous due to the pores being filled by nitrogen In a t-plot having a convex upward shape, the plot is on a straight line passing through the origin in a region in which the average adsorbed nitrogen gas layer thickness t is small, but, as t increases, the plot deviates downward from the straight line. When CNTs have a t-plot shape such as set forth above, this indicates that the internal specific surface area of the CNTs as a proportion relative to the total specific surface area of the CNTs is large and that numerous openings are formed in the CNTs. Consequently, in a situation in which such CNTs are used to produce a dispersion liquid, the CNTs have a low tendency to aggregate in the dispersion liquid, and it is possible to obtain an electromagnetic wave absorbing sheet that is homogeneous and has even better electromagnetic wave absorption performance in a high frequency region.

Note that a bending point of the t-plot for the CNTs preferably satisfies a range of $0.2 \leq t$ (nm)$\leq 1.5$, more preferably satisfies a range of $0.45 \leq t$ (nm)$\leq 1.5$, and even more preferably satisfies a range of $0.55 \leq t$ (nm)$\leq 1.0$. When CNTs having a t-plot with a bending point that is within any of the ranges set forth above are used to produce a dispersion liquid, such CNTs have an even lower tendency to aggregate in the dispersion liquid. Consequently, it is possible to obtain an electromagnetic wave absorbing sheet that is even more homogeneous and has even better electromagnetic wave absorption performance in a high frequency region.

The "position of the bending point" is an intersection point of a linear approximation A for the above-described process (1) and a linear approximation B for the above-described process (3).

A ratio (S2/S1) of the internal specific surface area S2 of the CNTs relative to the total specific surface area S1 of the CNTs obtained from the t-plot is preferably not less than 0.05 and not more than 0.30. When CNTs having an S2/S1 value that is within the range set forth above are used to produce a dispersion liquid, such CNTs have an even lower tendency to aggregate in the dispersion liquid. Consequently, it is possible to obtain an electromagnetic wave absorbing sheet that is even more homogeneous and has even better electromagnetic wave absorption performance in a high frequency region.

The total specific surface area S1 and the internal specific surface area S2 of the CNTs can be determined from the t-plot for the CNTs. Specifically, the total specific surface area S1 and external specific surface area S3 can first be determined from the gradient of the linear approximation of process (1) and the gradient of the linear approximation of process (3), respectively. The internal specific surface area S2 can then be calculated by subtracting the external specific surface area S3 from the total specific surface area S1.

Measurement of an adsorption isotherm of CNTs, preparation of a t-plot, and calculation of total specific surface area S1 and internal specific surface area S2 based on analysis of the t-plot can be performed, for example, using a BELSORP®-mini (BELSORP is a registered trademark in Japan, other countries, or both) produced by Bel Japan Inc., which is a commercially available measurement apparatus.

The BET specific surface area of the CNTs is preferably 600 $m^2/g$ or more, and more preferably 800 $m^2/g$ or more, and is preferably 2,000 $m^2/g$ or less, more preferably 1,800 $m^2/g$ or less, and even more preferably 1,600 $m^2/g$ or less. When the BET specific surface area is within any of the ranges set forth above, the electromagnetic wave absorbing sheet can display even better electromagnetic wave absorption performance in a high frequency region.

The average diameter of the CNTs is preferably 1 nm or more, and is preferably 60 nm or less, more preferably 30 nm or less, and even more preferably 10 nm or less.

The average length of the CNTs is preferably 10 μm or more, more preferably 50 μm or more, and even more preferably 80 μm or more, and is preferably 600 μm or less, more preferably 500 μm or less, and even more preferably 400 μm or less.

When CNTs having an average diameter and/or average length within any of the ranges set forth above are used to produce a dispersion liquid, such CNTs have a low tendency to aggregate in the dispersion liquid, and it is possible to obtain an electromagnetic wave absorbing sheet that is homogeneous and has even better electromagnetic wave absorption performance in a high frequency region.

The aspect ratio (length/diameter) of the CNTs is normally more than 10.

Note that the average diameter, average length, and aspect ratio of CNTs can be determined by measuring the diameters and lengths of 100 randomly selected CNTs using a scanning electron microscope or a transmission electron microscope.

Also note that single-walled CNTs for which a t-plot obtained from an adsorption isotherm exhibits a convex upward shape can be efficiently produced by, in the super growth method described above, forming the catalyst layer on the substrate surface by a wet process.

<Attached Amount of Carbon Nanotubes>

The attached amount of the carbon nanotubes in the presently disclosed electromagnetic wave absorbing sheet is required to be 5 mass % or more, is preferably 7 mass % or more, and more preferably 10 mass % or more, and is preferably less than 70 mass %, and more preferably 65 mass % or less. When the attached amount of the carbon nanotubes is 5 mass % or more, this means that the carbon nanotubes are contained in the electromagnetic wave absorbing sheet in a sufficient amount necessary for displaying electromagnetic wave absorption performance. Moreover, when the attached amount of the carbon nanotubes is within any of the preferred ranges set forth above, electromagnetic wave absorption performance of the electromagnetic wave absorbing sheet in a high frequency region can be further enhanced.

<Surface Resistance>

The surface resistance of the presently disclosed electromagnetic wave absorbing sheet is required to be 20 Ω/sq. or more, and is preferably 100 Ω/sq. or more. When the surface resistance of the electromagnetic wave absorbing sheet is 20 Ω/sq. or more, this means that the carbon nanotubes are not attached in a concentrated manner at the sheet surface. In a situation in which carbon nanotubes are attached in a concentrated manner at a sheet surface and are present as though forming a "layer", conductivity in a surface direction of the sheet is excellent due to carbon nanotubes being a conductive material, and thus surface resistance of the sheet may decrease. It is thought that in this situation, electromagnetic waves that are incident on the sheet surface are reflected by the sheet surface and do not tend to penetrate to the inside of the sheet. A surface resistance of 20 Ω/sq. or more is set as a condition for the presently disclosed electromagnetic wave absorbing sheet as previously described. This condition means that the carbon nanotubes are not attached in a manner forming a "layer" at the surface of the electromagnetic wave absorbing sheet. Moreover, when the carbon nanotubes are present inward in the thickness direction of the electromagnetic wave absorbing sheet without forming a "layer" at the surface of the electromagnetic wave absorbing sheet, electromagnetic waves that penetrate to the inside of the sheet can be diffusely reflected between carbon nanotubes inside the sheet. Consequently, electromagnetic waves can be attenuated inside the sheet due to this diffuse reflection. Note that the upper limit for the surface resistance can be 4,000 Ω/sq. or less, for example, but is not specifically limited thereto.

<Electromagnetic Wave Absorption Performance>

A transmission attenuation power ratio (Rtp) value of the presently disclosed electromagnetic wave absorbing sheet at 30 GHz is preferably 30 dB or more, and more preferably 40 dB or more. An electromagnetic wave absorbing sheet that can display such electromagnetic wave absorption performance can be used extremely well in applications in which high electromagnetic wave absorption performance in a high frequency region is required. Moreover, the transmission attenuation power ratio value of the presently disclosed electromagnetic wave absorbing sheet within a range of not less than 10 GHz and not more than 40 GHz is preferably 40 dB or more.

<Thickness>

The thickness of the presently disclosed electromagnetic wave absorbing sheet is preferably 100 μm or less, more preferably 68 μm or less, and even more preferably 60 μm or less. When the thickness of the electromagnetic wave absorbing sheet is not more than any of the upper limits set forth above, this thin electromagnetic wave absorbing sheet can suitably be used in various applications. Note that the thickness of the electromagnetic wave absorbing sheet is preferably 10 μm or more. When the thickness of the electromagnetic wave absorbing sheet is not less than the lower limit set forth above, the electromagnetic wave absorbing sheet can have sufficient mechanical strength and can display even better electromagnetic wave absorption performance in a high frequency region.

<Production Method>

The electromagnetic wave absorbing sheet can be produced by implementing a step of immersing a fibrous substrate in a dispersion liquid of carbon nanotubes (CNT dispersion liquid immersion step), a step of pulling out the immersed fibrous substrate and washing the fibrous substrate (washing step), a step of drying the washed fibrous substrate (drying step), and so forth. The following description outlines a production method according to one example.

<<CNT Dispersion Liquid Immersion Step>>

In the CNT dispersion liquid immersion step, a fibrous substrate is immersed in a dispersion liquid of carbon nanotubes. A fibrous substrate such as previously described in the "Sheet-shaped fibrous substrate" section can suitably be used as the fibrous substrate. The dispersion liquid of carbon nanotubes (CNT dispersion liquid) can be produced by dispersing CNTs in a dispersion medium. Moreover, CNTs such as previously described in the "Carbon nanotubes" section can suitably be used as the CNTs. The dispersion medium is not specifically limited and possible examples thereof include water, isopropanol (2-propanol), 1-methyl-2-pyrrolidone, dimethylformamide, dimethyl sulfoxide, dimethylacetamide, toluene, tetrahydrofuran, ethyl acetate, acetonitrile, ethylene glycol, methyl isobutyl ketone, and butyl alcohol. Of these examples, water is preferably used as the dispersion medium.

A dispersant may be compounded as an additive in production of the CNT dispersion liquid in order to improve dispersibility of the CNTs in the CNT dispersion liquid. The dispersant is not specifically limited and possible examples thereof include known surfactants such as sodium dodecylsulfonate, sodium deoxycholate, sodium cholate, and sodium dodecylbenzenesulfonate, and various synthetic polymers and natural polymers that can function as dispersants. Note that the additive amount of the dispersant can be set within a typical range.

In production of the CNT dispersion liquid, a CNT dispersion liquid having good CNT dispersibility can be obtained by adding the CNTs to a dispersion medium in which a surfactant such as described above is compounded so as to obtain a crude dispersion liquid, and then adopting a dispersion method in which a cavitation effect is obtained and/or a dispersion method in which a crushing effect is obtained, such as disclosed in WO2014/115560A1, with respect to the crude dispersion liquid that is obtained. Note that the method of dispersion is not limited to these two methods, and it is of course possible to adopt a method in which direct stirring is performed using a stirring bar.

In production of the CNT dispersion liquid, other components such as carbon materials other than carbon nanotubes, additives, and so forth can optionally be compounded in the CNT dispersion liquid. In a case in which another component is added, the other component can be added to the crude dispersion liquid of the CNTs, for example.

Note that the dispersing time in production of the CNT dispersion liquid can be set as not less than 1 minute and not more than 120 minutes, for example. Moreover, the CNT concentration in the CNT dispersion liquid can be set as not less than 0.01 mass % and not more than 0.3 mass %.

The immersion time when the fibrous substrate is immersed in the CNT dispersion liquid obtained as described above is not specifically limited and can, for example, be not less than 1 minute and not more than 3 hours. The immersion temperature is also not specifically limited and can, for example, be not lower than 0° C. and not higher than 100° C.

<<Washing Step>>

In the washing step, the fibrous substrate that has been immersed in the step described above is pulled out and is washed. A method that includes operations of immersing the fibrous substrate in an alcohol such as isopropanol (2-propanol), ethyl alcohol, or methyl alcohol and then immersing the fibrous substrate in water can suitably be adopted as the washing method. The immersion time in each solvent is not specifically limited and can, for example, be not less than 1 minute and not more than 3 hours. The immersion temperature in each solvent is also not specifically limited and can, for example, be not lower than 0° C. and not higher than 100° C.

<<Drying Step>>

In the drying step, the fibrous substrate that has been washed in the step described above is dried. The drying method may be hot-air drying, vacuum drying, hot-roll drying, infrared irradiation, or the like without any specific limitations. The drying temperature and the drying time can be adjusted as appropriate depending on the heat resistance of the fibrous substrate, the boiling point of a liquid used in washing, and so forth. The drying temperature is normally from room temperature to 200° C., but is not specifically limited thereto, and the drying time is normally not less than 10 minutes and not more than 48 hours, but is not specifically limited thereto.

Moreover, when the process flow from the CNT dispersion liquid immersion step to the drying step described above is taken to be one cycle, it is preferable that at least a plurality of cycles is implemented in production of the electromagnetic wave absorbing sheet. This makes it possible to obtain an electromagnetic wave absorbing sheet having carbon nanotubes well mounted up to the inside of the sheet. Note that the number of cycles is preferably 2 or more cycles, and is preferably 24 or fewer cycles, and more preferably 20 or fewer cycles. When the number of cycles is not less than the lower limit set forth above, the attached amount of the carbon nanotubes in the electromagnetic wave absorbing sheet can be sufficiently increased. Moreover, when the number of cycles is not more than any of the upper limits set forth above, attachment of the carbon nanotubes in a "layer" form at the surface of the electromagnetic wave absorbing sheet can be inhibited, and electromagnetic wave absorption performance in a high frequency region can be efficiently enhanced.

A feature of an electromagnetic wave absorbing sheet according to another example of the present disclosure is that the electromagnetic wave absorbing sheet has a transmission attenuation power ratio value of 40 dB or more within a range of not less than 10 GHz and not more than 40 GHz. This electromagnetic wave absorbing sheet may include a sheet-shaped fibrous substrate and a plurality of carbon nanotubes attached to the sheet-shaped fibrous substrate. Moreover, the attached amount of the carbon nanotubes in this electromagnetic wave absorbing sheet may be 5 mass % or more. The electromagnetic wave absorbing sheet according to this other example of the present disclosure has excellent electromagnetic wave absorption performance in a high frequency region.

EXAMPLES

The following provides a more detailed description of the present disclosure through examples. However, the present disclosure is not limited to these examples.

In the examples and comparative examples, the following methods were used to measure or calculate the BET specific surface area of carbon nanotubes, the attached amount of carbon nanotubes, the thickness of an electromagnetic wave absorbing sheet, the surface resistance of an electromagnetic wave absorbing sheet, and the electromagnetic wave absorption performance of an electromagnetic wave absorbing sheet.

<BET Specific Surface Area of Carbon Nanotubes>

The nitrogen adsorption specific surface area of carbon nanotubes used in the examples and comparative examples was measured in accordance with the BET method using a BELSORP®-mini (produced by Bel Japan Inc.).

<Attached Amount of Carbon Nanotubes>

The attached amount (mass %) of carbon nanotubes in each electromagnetic wave absorbing sheet produced in the examples and comparative examples was calculated based on the following formula using the mass (W0) of a fibrous substrate prior to attachment of carbon nanotubes and the mass (W1) of the fibrous substrate in a state with carbon nanotubes attached (i.e. the mass of the electromagnetic wave absorbing sheet), which were measured using an electronic balance.

Attached amount of carbon nanotubes(mass %)=
    (W1−W0)/W1×100

<Thickness of Electromagnetic Wave Absorbing Sheet>

The thickness of each electromagnetic wave absorbing sheet produced in the examples and comparative examples was measured using a Digimatic Outside Micrometer produced by Mitutoyo Corporation.

<Surface Resistance of Electromagnetic Wave Absorbing Sheet>

For each electromagnetic wave absorbing sheet produced in the examples and comparative examples, the surface resistance (Ω/sq.) was calculated by implementing a four-point probe method in which a probe was positioned on one side of the sheet in accordance with JIS K 7194:1994 using a resistivity meter for low resistance (Loresta® GX (Loresta is a registered trademark in Japan, other countries, or both) produced by Mitsubishi Chemical Analytech Co., Ltd.).

<Electromagnetic Wave Absorption Performance of Electromagnetic Wave Absorbing Sheet>

For each electromagnetic wave absorbing sheet produced in the examples and comparative examples, a reflection coefficient S11 (dB) and a transmission coefficient S21 (dB) were measured by a microstrip line method in accordance with IEC-62333, and a transmission attenuation power ratio Rtp (dB) was calculated using the following formula.

Transmission attenuation power ratio Rtp(dB)=10
    log$_{10}$\{10$^{S21-10}$/(1−10$^{S11/10}$)\}

Note that the measurement instrument and the measurement frequency range that were used were as follows. As indicated in Table 1, this evaluation focused on a value of the transmission attenuation power ratio Rtp at 30 GHz.

Measurement instrument: Vector Network Analyzer 37169A produced by Anritsu Corporation
Measurement frequency: 100 MHz to 40 GHz

Example 1

<Production of Carbon Nanotube Dispersion Liquid>

Sodium dodecylbenzenesulfonate (SDBS) was used as a dispersant and water was used as a dispersion medium to produce 500 mL of a 1 mass % aqueous solution of SDBS. Next, 0.5 g of SGCNTs (ZEONANO® SG101 (ZEONANO is a registered trademark in Japan, other countries, or both) produced by Zeon Nanotechnology Co., Ltd.; BET specific surface area: 1,050 $m^2$/g; average diameter: 3.3 nm; average length: 400 μm; convex upward t-plot (bending point position: 0.6 nm); internal specific surface area S2/total specific surface area S1: 0.24) as single-walled CNTs were added to this aqueous solution to obtain a crude dispersion liquid containing SDBS as a dispersant. The crude dispersion liquid containing the single-walled CNTs was loaded into a high-pressure homogenizer (produced by Beryu Corporation; product name: BERYU SYSTEM PRO) including a multistage pressure controller (multistage pressure reducer) applying back pressure during dispersing, and the crude dispersion liquid was subjected to dispersing treatment at a pressure of 100 MPa. Specifically, back pressure was applied while imparting shear force to the crude dispersion liquid so as to disperse the CNTs and obtain an SGCNT dispersion liquid of 0.1 mass % in concentration.

<CNT Dispersion Liquid Immersion Step, Washing Step, and Drying Step>

Vinylon non-woven fabric (basis weight: 12 g/$m^2$; thickness: 40 μm) as a sheet-shaped fibrous substrate of 5 cm×10 cm was immersed in 500 mL of the 0.1 mass % SGCNT dispersion liquid obtained as described above for 10 minutes under conditions of 30° C. (CNT dispersion liquid immersion step). Thereafter, the Vinylon non-woven fabric that had undergone the CNT dispersion liquid immersion step was immersed in 500 mL of 2-propanol (produced by Wako Pure Chemical Industries, Ltd.) for 10 minutes and was then immersed in 500 mL of distilled water for 10 minutes under conditions of 30° C. so as to wash the Vinylon non-woven fabric (washing step). The CNT-bearing fibrous substrate that had undergone the washing step was vacuum dried at a temperature of 60° C. for 3 hours to obtain a dried product of the CNT-bearing fibrous substrate (drying step).

The process flow of the CNT dispersion liquid immersion step, the washing step, and the drying step described above was taken to be one cycle, and two of such cycles were repeated to obtain an electromagnetic wave absorbing sheet. Various measurements and the like were performed with respect to the obtained electromagnetic wave absorbing sheet as previously described. The results are shown in Table 1 and FIG. 1. The graph illustrated in FIG. 1 is a plot of transmission attenuation power ratio on the vertical axis and frequency on the horizontal axis, and is a curve (hereinafter, also referred to as an "attenuation ratio curve") that indicates the attenuation ratio of electromagnetic waves as a function of frequency. The electromagnetic wave absorbing sheet obtained in this example had a transmission attenuation power ratio (Rtp) of 40 dB or more at 10 GHz to 40 GHz as clearly indicated in FIG. 1.

Examples 2 to 5

Electromagnetic wave absorbing sheets were obtained in the same way as in Example 1 with the exception that the number of cycles of the CNT dispersion liquid immersion step, the washing step, and the drying step that were performed was changed as indicated in Table 1, and the attached amount of carbon nanotubes in the obtained electromagnetic wave absorbing sheets, the surface resistance of the electromagnetic wave absorbing sheets, the thickness of the electromagnetic wave absorbing sheets, and so forth were changed as indicated in Table 1. Various measurements and calculations were performed with respect to the obtained electromagnetic wave absorbing sheets by the previously described methods. The results are shown in Table 1. Note that because attenuation ratio curves obtained as a result of evaluation of electromagnetic wave absorption performance in these examples had similar shapes to the curve of Example 1 that is illustrated in FIG. 1, these attenuation ratio curves are omitted in FIG. 1 for the sake of clear illustration. Also note that the electromagnetic wave absorbing sheets obtained in these examples all had a transmission attenuation power ratio (Rtp) of 40 dB or more at 10 GHz to 40 GHz.

Comparative Examples 1 and 2

Electromagnetic wave absorbing sheets were obtained in the same way as in Example 1 with the exception that the number of cycles of the CNT dispersion liquid immersion step, the washing step, and the drying step that were performed was changed as indicated in Table 1, and the attached amount of carbon nanotubes in the obtained electromagnetic wave absorbing sheets, the surface resistance of the electromagnetic wave absorbing sheets, the thickness of the electromagnetic wave absorbing sheets, and so forth were changed as indicated in Table 1. Various measurements and calculations were performed with respect to the obtained electromagnetic wave absorbing sheets by the previously described methods. The results are shown in Table 1 and FIG. 1. It can be seen from FIG. 1 that the electromagnetic wave absorbing sheets obtained in Comparative Examples 1 and 2 both had a transmission attenuation power ratio (Rtp) of less than 40 dB at 10 GHz to 40 GHz.

TABLE 1

| | | | Example 1 | Example 2 | Example 3 | Example 4 | Example 5 | Comparative Example 1 | Comparative Example 2 |
|---|---|---|---|---|---|---|---|---|---|
| Electromagnetic wave absorbing sheet | Fibrous substrate | Basis weight (g/$m^2$) | 12 | 12 | 12 | 12 | 12 | 12 | 12 |
| | Carbon nano tubes | BET specific surface area ($m^2$/g) | 1050 | 1050 | 1050 | 1050 | 1050 | 1050 | 1050 |
| | Number of cycles in production (cycles) | | 2 | 4 | 8 | 16 | 20 | 1 | 25 |
| | Attached amount of carbon nanotubes (mass %) | | 12 | 16 | 27 | 50 | 60 | 2.4 | 70 |
| | Surface resistance (Ω/sq.) | | 1200 | 1000 | 760 | 290 | 20 | 5300 | 8 |
| | Thickness (μm) | | 50 | 49 | 51 | 58 | 65 | 45 | 70 |

TABLE 1-continued

| | | | Example 1 | Example 2 | Example 3 | Example 4 | Example 5 | Comparative Example 1 | Comparative Example 2 |
|---|---|---|---|---|---|---|---|---|---|
| Evaluation | Electromagnetic wave absorption performance | Rtp at 30 GHz (dB) | 52 | 50 | 50 | 49 | 45 | 21 | 26 |

It can be seen from Table 1 and FIG. 1 that electromagnetic wave absorbing sheets having an attached amount of carbon nanotubes of 5 mass % or more and a surface resistance of 20 Ω/sq. or more had a transmission attenuation power ratio (Rtp) value of 45 dB or more at 30 GHz and had excellent electromagnetic wave absorption performance in a high frequency region. It can also be seen that in Comparative Example 1 in which the attached amount of carbon nanotubes was less than 5 mass % and Comparative Example 2 in which the surface resistance was less than 20 Ω/sq., the transmission attenuation power ratio (Rtp) value at 30 GHz was 26 dB or less, and electromagnetic wave absorption performance in a high frequency region was poor.

In particular, electromagnetic waves are thought to pass through the electromagnetic wave absorbing sheet in Comparative Example 1 due to the attached amount of carbon nanotubes being insufficient. For this reason, it is thought that the electromagnetic wave absorbing sheet in accordance with Comparative Example 1 could not sufficiently absorb high frequency electromagnetic waves.

Moreover, based on the low value for surface resistance in Comparative Example 2, the carbon nanotubes are thought to have formed a layer at the surface of the electromagnetic wave absorbing sheet. For this reason, it is thought that sufficient electromagnetic wave absorption performance cannot be displayed because electromagnetic waves are reflected by the layer of carbon nanotubes at the surface of the electromagnetic wave absorbing sheet.

Note that from the relationship between the number of cycles and the attached amount of carbon nanotubes in the examples and comparative examples, it can be seen that an increase of the attached amount of carbon nanotubes with increasing number of cycles tends to reach saturation. It is also thought that in a cycle in which the increasing trend of attached amount of CNTs has reached saturation, carbon nanotubes attached to the fibrous substrate readily form a layer at the surface of the electromagnetic wave absorbing sheet, and that this reduces the electromagnetic wave absorption performance of the obtained electromagnetic wave absorbing sheet.

INDUSTRIAL APPLICABILITY

According to the present disclosure, it is possible to provide an electromagnetic wave absorbing sheet having excellent electromagnetic wave absorption performance in a high frequency region.

The invention claimed is:

1. An electromagnetic wave absorbing sheet comprising: a sheet-shaped fibrous substrate; and a plurality of carbon nanotubes attached to the sheet-shaped fibrous substrate, wherein
the sheet-shaped fibrous substrate is a non-woven fabric,
an attached amount of the carbon nanotubes is 5 mass % or more and less than 70 mass %,
the carbon nanotubes are attached to fibers located at a surface of the non-woven fabric and the carbon nanotubes are attached to fibers located inward of the surface in a thickness direction of the non-woven fabric,
the electromagnetic wave absorbing sheet has a surface resistance of 20 Ω/sq. or more and 1,200 Ω/sq. or less, and
the sheet-shaped fibrous substrate is non-woven fabric having a basis weight of 2 $g/m^2$ or more and 50 $g/m^2$ or less.

2. The electromagnetic wave absorbing sheet according to claim 1, having a thickness of 10 μm or more and 100 μm or less.

3. The electromagnetic wave absorbing sheet according to claim 1, wherein the carbon nanotubes have a BET specific surface area of 600 $m^2/g$ or more and 2,000 $m^2/g$ or less.

4. The electromagnetic wave absorbing sheet according to claim 1, wherein the sheet-shaped fibrous substrate is non-woven fabric having a basis weight of 2 $g/m^2$ or more and 30 $g/m^2$ or less.

5. An electromagnetic wave absorbing sheet comprising: a sheet-shaped fibrous substrate; and a plurality of carbon nanotubes attached to the sheet-shaped fibrous substrate, wherein
the sheet-shaped fibrous substrate is a non-woven fabric,
an attached amount of the carbon nanotube is 5 mass % or more and less than 70 mass %,
the carbon nanotubes are attached to fibers located at a surface of the non-woven fabric and the carbon nanotubes are attached to fibers located inward of the surface in a thickness direction of the non-woven fabric,
the electromagnetic wave absorbing sheet has a transmission attenuation power ratio value of 40 dB or more within a range of not less than 10 GHz and not more than 40 GHz, and
the sheet-shaped fibrous substrate is non-woven fabric having a basis weight of 2 $g/m^2$ or more and 50 $g/m^2$ or less.

\* \* \* \* \*